United States Patent
deRochemont et al.

(10) Patent No.: US 6,323,549 B1
(45) Date of Patent: Nov. 27, 2001

(54) CERAMIC COMPOSITE WIRING STRUCTURES FOR SEMICONDUCTOR DEVICES AND METHOD OF MANUFACTURE

(75) Inventors: L. Pierre deRochemont, 11 Merrill Industrial Dr., Suite A7, Hampton, NH (US) 03842; Peter H. Farmer, Longmeadow, MA (US)

(73) Assignee: L. Pierre deRochemont, Hampton, NH (US)

( * ) Notice: Subject to any disclaimer, the term of this patent is extended or adjusted under 35 U.S.C. 154(b) by 0 days.

(21) Appl. No.: 09/344,682

(22) Filed: Jun. 25, 1999

Related U.S. Application Data

(63) Continuation of application No. PCT/US97/23976, filed on Dec. 29, 1997, which is a continuation-in-part of application No. 08/004,928, filed on Jan. 9, 1998, which is a continuation-in-part of application No. 08/697,739, filed on Aug. 29, 1996.
(60) Provisional application No. 60/033,983, filed on Dec. 30, 1996.

(51) Int. Cl.[7] ............................ H01L 23/06; H01L 23/10; H01L 23/15
(52) U.S. Cl. ........................ 257/703; 257/675; 257/703
(58) Field of Search ....................... 257/703, 700, 257/675, 678, 734, 723; 438/106, 121, 125

(56) References Cited

U.S. PATENT DOCUMENTS

| | | | |
|---|---|---|---|
| 3,869,312 | 3/1975 | Moss et al. | 117/215 |
| 4,071,385 | 1/1978 | Kuris | 156/73.1 |
| 4,267,210 | 5/1981 | Yajima et al. | 427/226 |
| 4,372,037 | 2/1983 | Scapple et al. | 29/613 |
| 4,410,874 | 10/1983 | Scapple et al. | 338/307 |
| 4,551,357 | 11/1985 | Takeuchi | 427/96 |
| 4,598,167 | 7/1986 | Usifusa et al. | 174/68.5 |

(List continued on next page.)

FOREIGN PATENT DOCUMENTS

| | | | |
|---|---|---|---|
| 0380115 | of 1980 | (EP) . | |
| WO 98/08672 | 3/1998 | (WO) | B32B/3/00 |

OTHER PUBLICATIONS

P. Arendt, et al. Fabrication of Biaxially Oriented YBCO ON (001) Biaxially Oriented Yttria–Stabilized–Zirconia On Polycrystlline Substrates MRS Symposium Proceedings on Epitaxial Oxide Thin Films and Heterostructures, MRS Bulletin 341 (1994).

S. R. Foltyn, et al. Pulsed Laser Deposition of Thick $YBa_2Cu_3O_7-\delta$ Films On Substrates Proceedings of the International Workshop on Superconductivity, Jun. 18–21, 1995, Maui, Hawaii.

(List continued on next page.)

*Primary Examiner*—Jhihan B. Clark
(74) *Attorney, Agent, or Firm*—Perkins, Smith & Cohen, LLP; Jerry Cohen

(57) ABSTRACT

A composite wiring structure (10) for use with at least one semiconductor device (16). The composite wiring structure having a first conductive member (12) upon which the semiconductor device can be mounted for electrical connection thereto. A dielectric member (20), made of ceramic or organo-ceramic composite material, is bonded to the first conductive member (12) and contains embedded therein a conductive network (24) and a thermal distribution network (26). A second conductive member (32) may be incorporated with the composite wiring structure, with a capacitor (64) being electrically connected between the conductive network (24) and the second conductive member (32). Bonding between the dielectric member and the conductive members may be in the form of a direct covalent bond formed at a temperature insufficient to adversely effect the structural integrity of the conductive network and the thermal distribution network.

57 Claims, 8 Drawing Sheets

U.S. PATENT DOCUMENTS

| | | | |
|---|---|---|---|
| 4,679,321 | 7/1987 | Plonski | 29/850 |
| 4,770,953 | 9/1988 | Horiguchi et al. | 428/698 |
| 4,880,770 | 11/1989 | Mir et al. | 505/1 |
| 4,942,079 | 7/1990 | Kumagai et al. | 428/209 |
| 4,950,643 | 8/1990 | Agostinelli et al. | 505/1 |
| 4,959,507 | 9/1990 | Tanaka et al. | 174/260 |
| 4,981,761 | 1/1991 | Ookouchi et al. | 428/594 |
| 4,987,677 | 1/1991 | Tanaka et al. | 29/846 |
| 5,010,053 | 4/1991 | Maroni | 505/1 |
| 5,011,732 | 4/1991 | Takeuchi et al. | 428/209 |
| 5,024,883 | 6/1991 | SinghDeo et al. | 428/323 |
| 5,071,828 | 12/1991 | Greuter et al. | 505/1 |
| 5,077,270 | 12/1991 | Takeda et al. | 505/1 |
| 5,096,878 | 3/1992 | Hoshino et al. | 505/1 |
| 5,104,849 | 4/1992 | Shiga et al. | 505/1 |
| 5,108,026 | 4/1992 | Su et al. | 228/122 |
| 5,113,315 | 5/1992 | Capp et al. | 361/386 |
| 5,116,808 | 5/1992 | Belouet | 505/1 |
| 5,153,077 | 10/1992 | Kashiba et al. | 428/627 |
| 5,155,665 | 10/1992 | Komorita et al. | 361/400 |
| 5,168,420 | 12/1992 | Ramesh et al. | 505/1 |
| 5,187,149 | 2/1993 | Jin et al. | 505/1 |
| 5,251,803 | 10/1993 | Kashiba et al. | 228/124 |
| 5,256,443 | 10/1993 | Tomita | 427/125 |
| 5,256,469 | 10/1993 | Cherukuri et al. | 428/210 |
| 5,300,163 | 4/1994 | Ohtaki | 156/89 |
| 5,318,800 | 6/1994 | Gong et al. | 427/229 |
| 5,338,598 | 8/1994 | Ketcham | 428/210 |
| 5,342,653 | 8/1994 | Simon et al. | 427/256 |
| 5,348,805 | 9/1994 | Zagdoun et al. | 428/432 |
| 5,363,277 | 11/1994 | Tanaka | 361/760 |
| 5,363,280 | 11/1994 | Chobot et al. | 361/794 |
| 5,375,039 | 12/1994 | Wiesa | 361/720 |
| 5,396,034 | 3/1995 | Fujita et al. | 174/261 |
| 5,430,008 | 7/1995 | Morris | 505/150 |
| 5,470,668 | 11/1995 | Wu et al. | 428/688 |
| 5,473,511 | 12/1995 | Reddy et al. | 361/719 |
| 5,475,264 | * 12/1995 | Sudo et al. | 257/723 |
| 5,540,981 | 7/1996 | Gallagher et al. | 428/220 |
| 5,548,481 | 8/1996 | Salisbury et al. | 361/709 |
| 5,562,973 | 10/1996 | Nagasaka et al. | 428/210 |
| 5,600,541 | 2/1997 | Bone et al. | 361/707 |
| 5,602,421 | 2/1997 | Li | 257/728 |
| 5,604,018 | 2/1997 | Horiuchi et al. | 428/210 |
| 5,621,190 | 4/1997 | Yamasaki et al. | 174/82.4 |
| 5,669,136 | * 9/1997 | Magee | 29/830 |
| 5,700,549 | 12/1997 | Garant et al. | 428/210 |
| 5,707,715 | 1/1998 | deRochemont et al. | 428/210 |
| 5,714,801 | 2/1998 | Yano et al. | 257/691 |
| 5,725,938 | 3/1998 | Jin et al. | 428/210 |
| 5,731,066 | 3/1998 | Ando et al. | 428/210 |
| 5,731,067 | 3/1998 | Asai et al. | 428/210 |
| 5,752,182 | 5/1998 | Nakatsuka et al. | 455/333 |
| 5,768,109 | 6/1998 | Gulick et al. | 361/794 |
| 5,773,197 | 6/1998 | Carter et al. | 430/313 |
| 5,818,079 | 10/1998 | Noma et al. | 257/295 |
| 5,821,162 | 10/1998 | Yamaha et al. | 438/623 |
| 5,838,545 | 11/1998 | Clocher et al. | 361/719 |
| 5,866,252 | 2/1999 | deRochemont et al. | 428/373 |
| 5,870,823 | 2/1999 | Bezama et al. | 29/848 |
| 5,883,219 | 3/1999 | Carter et al. | 528/310 |
| 5,904,576 | 5/1999 | Yamaha et al. | 438/788 |
| 5,919,546 | 7/1999 | Horiuchi et al. | 428/131 |
| 5,962,113 | 10/1999 | Brown et al. | 428/209 |
| 5,997,999 | 12/1999 | Horiuchi et al. | 428/210 |

OTHER PUBLICATIONS

X.D. Wu, et al. High Current $YBa_2Cu_3O_7-\delta$ Thick Films On Flexible Nickel Substrates With Textured Buffer Layers Applied Physics Letters 65 (15), Oct. 10, 1994.

S. R. Foltyn, et al. Pulsed Laser Deposition of Thick $YBa_2Cu_3O_7-\delta$ Films and $J_c>1$ $MA/cm^2$ Appeared in Applied Physics Letters, 63 (13), Sep. 27, 1993.

Hiroyuki Nasu, et al. Superconducting Y–Ba–Cu–O Films with Tc>70 K Prepared Thermal Decomposition Technique of Y–,and cu 2ethylhexanoates Chemistry Letters pp. 2403–2404 (1987).

Hiroyuki Nasu, et al., $Ba_24CU_3Or$ films with $T_c(end)>80K$ prepared by the pyrolysis of 2–ethylhexanoates Journal of Materials Science Letters 7 88 858–260 (1986).

W.J. DeSisto, et al. $YB2_2Cu_3O_7-\delta$ thin films deposited by an ultrasonic nebulization and pyrolysis method Thin Solid Films, 206, pp. 128–131 (1991).

Pierre deRochemont, et al. Fabricating Multifilamentary High–$T_c$ Superconducting Bismuth Cuprate Tapes By Metalorganic Chemical Spray Pryolysis *Applied Superconductivity*, vol. 2, No. 3/4, pp. 281–294, 1994.

P. Arendt, et al. Highly–Textured Ti–Ba–Ca–Cu–O Polycrystalline Superconducting Films on Ag Substrates Science and Technology of Thin Film Superconductors 2, ed. By McConnell and Noufi, Plenum Press, New York, 1990.

* cited by examiner

CERAMIC COMPOSITE WIRING STRUCTURES FOR SEMICONDUCTOR DEVICES AND METHOD OF MANUFACTURE

CROSS REFERENCE TO RELATED APPLICATION

This application is a continuation of copending International Application number PCT/US97/23976 filed Dec. 29, 1997 which in turn claims priority of the inventors' earlier filed provisional application Ser. No. 60/033,983 filed Dec. 30, 1996 entitled Ceramic Composite Wiring Structures for Semiconductor Devices and Method of Manufacture.

This application is also a continuation-in-part of U.S. patent application Ser. No. 09/004,928 filed Jan. 9, 1998 entitled CERAMIC COMPOSITES WITH IMPROVED INTERFACIAL PROPERTIES AND METHODS TO MAKE SUCH COMPOSITES which in turn is a continuation-in-part of U.S. patent application Ser. No. 08/697,739 filed Aug. 29, 1996 entitled METAL CERAMIC COMPOSITES WITH IMPROVED INTERFACIAL PROPERTIES AND METHODS TO MAKE SUCH COMPOSITES and now U.S. Pat. No. 5,707,715. A counterpart PCT application Ser. No. PCT/US97/14913 of the above U.S. patent application Ser. No. 08/697,739 was filed on Aug. 25, 1997 and subsequent applications were filed in Europe and Mexico.

BACKGROUND OF THE INVENTION

The present invention relates generally to circuit wiring boards and, more particularly, to ceramic composite circuit wiring boards and/or multichip modules and methods to construct the same.

Semiconductor integrated circuits ("SIC") or semiconductor chips are being developed to operate at increasingly higher speeds and to handle larger volumes of data. This trend has caused the density of electrical interconnections required between the semiconductor chip and the larger electronic system to increase dramatically. Conversely, this ultra-large scale integration restricts the physical dimensions of the SIC. The drive to implement more sophisticated SIC's which require much larger numbers of electrical interconnections to be crammed into smaller physical dimensions creates a technical bottleneck, wherein SIC performance is increasingly limited by the circuit board/package connecting the chip to the larger electronic system.

The industry convention has been to use a lead frame that electrically interconnects the SIC to a printed circuit board ("PCB"), and to envelop the chip and lead frame in a ceramic laminate package. The packaged SIC is socketed to the PCB, which electrically connects the SIC to the larger electronic system. The modern, more sophisticated SIC's generate greater amounts of heat than their predecessors. This heat, if not dissipated from the SIC, reduces circuit performance. Robust lead frames have been able to function as both electrical connection and heat sink, however, as the density of leads per unit area has increased, the physical dimension of the individual lead must be shrunk. Smaller lead sizes sharply limit their function as a heat sink. This has forced system manufacturers to dissipate thermal loads through unmanageably large heat sinks attached to the SICs, which hampers the drive towards smaller, mobile platforms.

Furthermore, the operating speed of the more sophisticated SICs is increasingly limited by the printed circuit board. Conventional PCBs have routed electrical signals between system and SIC through an electrode network patterned on the PCB surface on which the semiconductor chip is mounted. To allow the SIC to operate at higher speed the interconnections between the semiconductor chip and the electronic system must be low-resistance. Lower resistance electrical contact is achieved by shortening electrode length and by decreasing electrode resistivity. Shorter electrode lengths are engineered by embedding an electrical interconnection network within the circuit board rather than one patterned on the surface. The prior art discloses methods to construct multilayer ceramic composite printed circuit boards with electrical interconnection networks embedded within the circuit boards. However, these methods are performance-limited because the embedded electrode network is composed of metallic films, conducting pastes, or both, which have much higher electrical resistance than the wire form of the same conducting metal. Lower-resistance at higher signal frequency is also enhanced by forming the wiring board from low dielectric constant materials. Therefore, circuit wiring board and multichip module designs that comprise electrode networks of conducting metal wire embedded within a low dielectric ceramic, such as silica or alumina, and simultaneously contain heat sinks, embedded within the ceramic to dissipate heat generated by the SIC would be highly desirable.

Relevant prior art includes the following patents. Fujita et al., U.S. Pat. No. 5,396,034, discloses methods to construct a thin film ceramic multilayer wiring hybrid board. Bonham et al., U.S. Pat. No. 5,396,032, discloses the construction of a multi-chip module ("MCM") with two sets of lead frames, one set supplying input/output bond pads, and another independent set to provide electrical contact to test pins that can be used to isolate and examine the performance of one or multiple devices mounted on a substrate within a cavity of said MCM, wherein the device(s) is (are) wire bonded to said pads. The material comprising the MCM package body can be ceramic, plastic, laminate, or metal, but the substrate on which the devices are mounted does not contain internal electrical interconnects and/or heat sinks. Wiesa, U.S. Pat. No. 5,375,039, discloses the construction of a printed circuit board with internal heat dissipation means channeling heat from power units mounted on the board to heat sinks, wherein the core of the printed circuit board comprises glass cloth. Chobot et al., U.S. Pat. No. 5,363,280, discloses methods to construct a multilayer ceramic circuit board in which some metal film layers function as electrode networks, and are separated from other metal film layers which function as heat sinks. Ohtaki et al., U.S. Pat. No. 5,300,163, discloses a process to fabricate a multilayer ceramic circuit board comprising a ceramic substrate, multiple layers of green tape with conductive paste patterns therein, and via holes with conductive paste to electrically interconnect the assembled layers. Cherukuri et al., U.S. Pat. No. 5,256,469, discloses a multilayered co-fired ceramic-on-metal circuit board prepared using ceramic green tapes and a system of low-temperature, high expansion glass ceramics. Capp et al., U.S. Pat. No. 5,113,315, discloses the construction of ceramic circuit board structures in which heat dissipation extensions are embedded in the ceramic member by laser drilling holes into the ceramic member and filling the holes with conductive metal using well-known metal deposition techniques. Plonski, U.S. Pat. No. 4,679,321, discloses a method of making interconnection boards with coaxial wire interconnects on the external major surface of the board substrate that opposes the major surface upon which integrated circuits are mounted. Ushifusa et al., U.S. Pat. No. 4,598,167, discloses the construction of multilayered ceramic circuit board that comprises a plurality of integrally bonded ceramic layers, each having a patterned electrically conducting paste layer and through holes filled with electrical conductors for connecting the patterned electrically conducting layers on respective ceramic layers to form a predetermined wiring circuit. Takeuchi, U.S. Pat. No. 4,551,357, discloses a manufacturing process for ceramic circuit boards that comprises firing a circuit pattern formed from an organic-laden conductive paste on the surface of a green-state ceramic with an organic binder.

It is therefore an object of the present invention to provide a composite wiring structure which enhances SIC performance.

It is another object of this invention to provide a composite circuit wiring structure which increases the allowable operating speeds of SICs.

It is a further object of this invention to reduce compressive and shear stresses within the composite structure.

It is another further object of this invention to provide a composite circuit wiring board structure wherein the structure's dielectric member is either a ceramic or an organo-ceramic composite.

It is still another object of this invention to provide a highly efficient and effective ceramic composite wiring structure for SICs and the method of manufacture thereof.

SUMMARY OF THE INVENTION

The objects set forth above as well as further objects and advantages of the present invention are achieved by the preferred embodiments of the invention described herein.

The preferred embodiments include a composite circuit wiring structure having one or more electrodes on one major surface of a dielectric member, and wherein a semiconductor integrated circuit ("SIC") is placed in direct electrical contact with the electrodes which are electrically contacted, through an electrical interconnection network within the dielectric ceramic member, to an external input/output signal driver.

Still further the preferred embodiments provide a composite circuit wiring structure wherein the dielectric member also contains an embedded thermal distribution network.

Even further the preferred embodiments provide a composite circuit wiring structure having one or more electrodes on one major surface of a dielectric member, and wherein at least one SIC is placed on a mounting area and electrically contacted to at least one electrode through a conducting wire means.

Still further the preferred embodiments reduce thermally generated compressive or shear stresses between the circuit wiring board's dielectric member and the embedded electrical interconnection network or the embedded thermal distribution network through the use of networks with curved joints.

Even further this invention reduces thermally generated compressive or shear stresses between the circuit wiring board's dielectric member and the embedded electrical interconnection network or the embedded thermal distribution network through the application of organic resins with high thermal decomposition temperatures to the networks prior to embedding the networks in the ceramic member.

Still further the present invention permits the inclusion of blocking capacitors with the dielectric member of the composite wiring structure.

Even further still the present invention provides the above-mentioned embodiments to be constructed with a ceramic or an organo-ceramic material as the dielectric member of the composite wiring structure.

More specifically a preferred embodiment of this invention relates to a dielectric (ceramic or organo-ceramic) composite circuit wiring board having one or more electrodes on one major surface of a ceramic member and wherein a semiconductor integrated circuit ("SIC") is placed in direct electrical contact with the electrodes. The SIC is electrically contacted, through an electrical interconnection network, made up of a conductive wire, preferably of copper wire, to other SIC's electrically contacted to other electrodes on the circuit wiring board's major surface, and/or to an external input/output signal driver that is electrically contacted to the ceramic circuit wiring board. This is accomplished either through yet another electrode on the circuit wiring board's major surface, or through a segment of conductive wire, connected to the electrical interconnection network, that protrudes through a minor surface of the circuit wiring board's dielectric member. The dielectric member also contains an embedded thermal distribution network of heat sinks, formed from elongated thermally conducting material such as metal, or hollow tubes in which a heat absorbing fluid is circulated. The embedded thermal distribution network is located in the vicinity of, but not in direct contact with, the electrodes making direct electrical contact with the SIC, and the terminal points of the embedded heat sinks protrude through a minor surface of the ceramic member to make thermal contact with a further heat sink or thermal reservoir that is external to the circuit wiring board.

As an example, the dielectric member comprises aluminate or silicate ceramic phases. Silica ceramic phases are particularly preferred to reduce the level of signal attenuation through dielectric loss mechanisms at higher signal frequencies. Another metal member is bonded to the major surface of the circuit wiring board's ceramic member that opposes the major surface on which the SIC is contacted to the electrodes. The invention also encompasses methods to construct the circuit wiring board structure through low-temperature processing methods.

The use of solution precursors allows ceramic to be formed around the network assemblies by filling the area bordered by the mold materials, mounting supports, and the base metal member with liquid precursor and driving the chemical reaction that transforms the liquid precursor into the corresponding solid state ceramic. The invention preferably incorporates therein the use of metalorganic precursors, whereby metal precursors to the ceramic oxide are first reacted with a carboxylic acid, such as 2-ethylhexanoic acid, to form a solution of carboxylic acid salts in organic acid solution. However, other solution processing techniques, such as sol-gel techniques, could also work as effectively and is considered to be within the spirit and scope of the invention.

The area filled with liquid precursor is filled with ceramic after the transforming chemical reaction is completed. As described below, the transforming chemical reaction bonds the ceramic to the network assemblies, the metal member, and the walls of the bordering mold materials and/or mounting supports. The liquid properties of the solution allow precursor materials to uniformly envelop the network assemblies. When metalorganic precursors are used, pyrolytic action decomposes the carboxylic acid salts into their corresponding metal oxides. Unstable metal oxide radicals are formed as a result of pyrolysis, which rapidly bond to stable organic and inorganic surfaces that are part of the network assemblies, the base metal member, and the mold materials and/or mounting supports. The unstable metal oxide radicals also bond with other decomposing metal oxide radicals to form a contiguous ceramic network.

The volume fraction of solid state ceramic is less than the volume solution precursor as the decomposition (or unwanted reaction) products are removed. Thus, it is advantageous to utilize a high solid content precursor solution, which is often quite viscous; or to pyrolyze the precursor in situ as it is applied, as is the case when the precursors are spray pyrolyzed onto an already heated assembly.

The action of spray pyrolysis allows undesirable reaction by-products, such as the precursor solvent and decomposition products to be physically removed at a much faster rate than the ceramic precursors are applied and simultaneously formed into ceramic. Thus, spray pyrolysis allows a higher volume fraction of solid state ceramic to occupy the region into which it is being applied.

The present invention also permits the formation of an organo-ceramic dielectric, if such a dielectric member is desired, through the incomplete decomposition of the dissolved metalorganic ceramic precursors. The present invention forms metalorganic precursors by directly or indirectly reacting the metal precursor(s) with a carboxylic acid solvent to produce a solution of carboxylic acid salt(s) dissolved within the carboxylic acid. 2-Ethylhexanoic acid is a preferred solvent and has a flash point of 210 degrees C. 2-Ethylhexanoate precursor salts will typically begin to decompose over temperatures in the range of 225–375 degrees C., depending upon the chemistry of salt's metal. Thermal decomposition is usually complete at temperatures above 400–475 degrees C. A composite organo-ceramic dielectric can be formed by spray-pyrolyzing the solution on to the circuit wiring board assembly heated to temperatures above the initial decomposition temperature(s) of the dissolved carboxylic acid salt(s), (225–375 degrees C.), yet below the temperatures at which the salt(s)'s organic ligands thoroughly decompose, (400–475 degrees C.). During spray-pyrolytic decomposition the carboxylic acid evaporates, depositing waxy carboxylic acid salts that decompose in situ. When the circuit wiring board assembly is heated to an appropriate temperature, the resultant dielectric material is a matrix of fully deflagrated oxide ceramic with incompletely decomposed organic material, thereby producing an organo-ceramic dielectric member.

Another embodiment of the present invention relates to a dielectric (for example, the dielectric being either a "pure" ceramic or organo-ceramic) composite circuit wiring board that comprises a metal member including one or more electrodes, and one or more mounting areas, all on one major surface of a ceramic member. At least one SIC is placed on the mounting area and electrically contacted to at least one electrode through a conducting wire means. The SIC is in further electrical contact, through an electrical interconnection network to other SIC's in electrical contact with other electrodes on the dielectric circuit wiring board's major surface, or to an external input/output signal driver that is electrically contacted to the dielectric circuit wiring board either through yet another electrode on the circuit wiring board's major surface, or through a segment of conductive wire, preferably copper wire, connected to the electrical interconnection network, that protrudes through a minor surface of the circuit wiring board's dielectric member. The dielectric member also contains an embedded thermal distribution network which includes heat sinks formed from elongated thermally conducting material such as metal, or hollow tubes in which a heat absorbing fluid is circulated. The thermal distribution network may or may not be in thermal contact with the SIC through the mounting area, and the terminal points of the embedded heat sinks protrude through a minor surface of the dielectric member to make thermal contact with a thermal reservoir that is external to the circuit wiring board. The dielectric member may be composed of aluminate or silicate ceramic phases. Another metal member is bonded to the major surface of the circuit wiring board's dielectric member that opposes the major surface on which the SIC is contacted to the mounting area and the electrodes.

Two methods are employed within the present invention to reduce the deleterious effects of stress on the dielectric member and the embedded network structures. The first deploys curves in the design of the embedded network structures to high stress points that result from sharp edged structures. When the network structures are designed with curved, rather than sharp-cornered L-joints and T-joints the stress is more evenly distributed over the radial arcs, as opposed to building up intense compressive forces at the sharp critical points in the network. Second, compressive stress is also reduced in the network by coating the (copper) metal wire forming the electrical interconnection network and the heat pipes forming the thermal dissipation network with an organic resin.

For a better understanding of the present invention, together with other and further objects thereof, reference is made to the following description taken in conjunction with the accompanying drawings and its scope will be pointed out in the appended claims.

DETAILED DESCRIPTION OF THE PREFERRED EMBODIMENTS

Figure 1A:
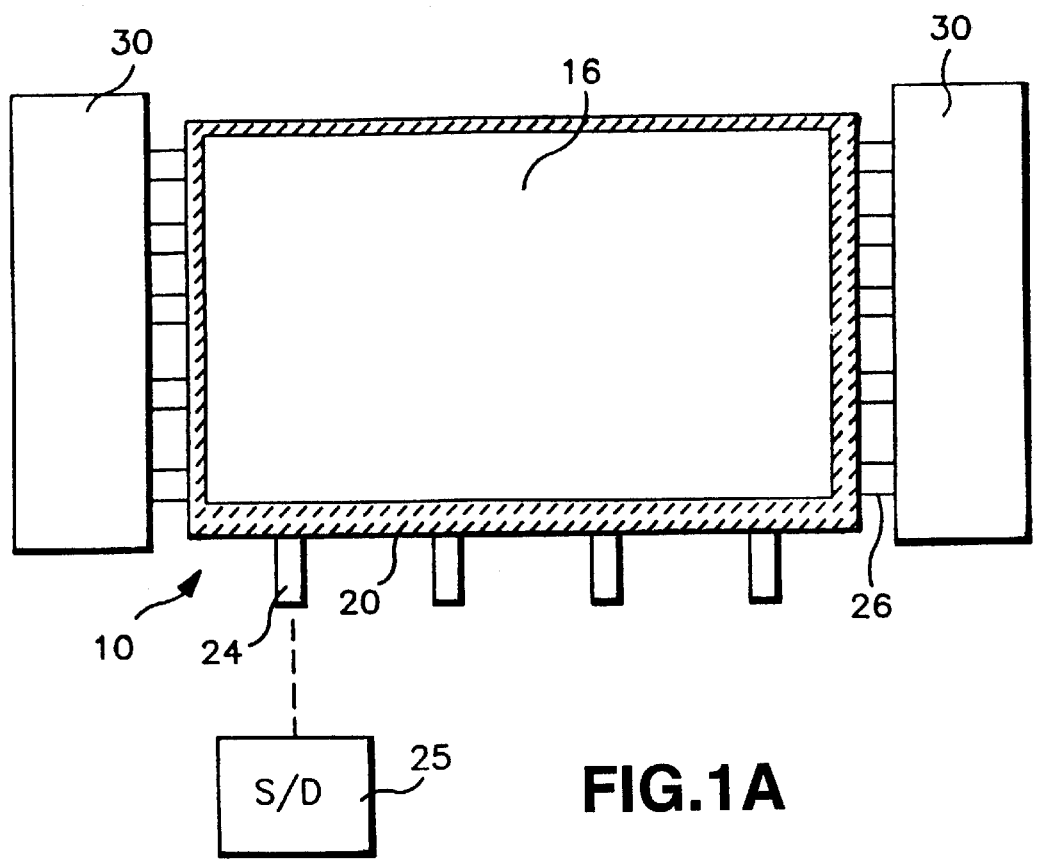
FIG. 1A shows a top view of a preferred embodiment of the dielectric composite wiring structure of this invention.
Figure 1B:
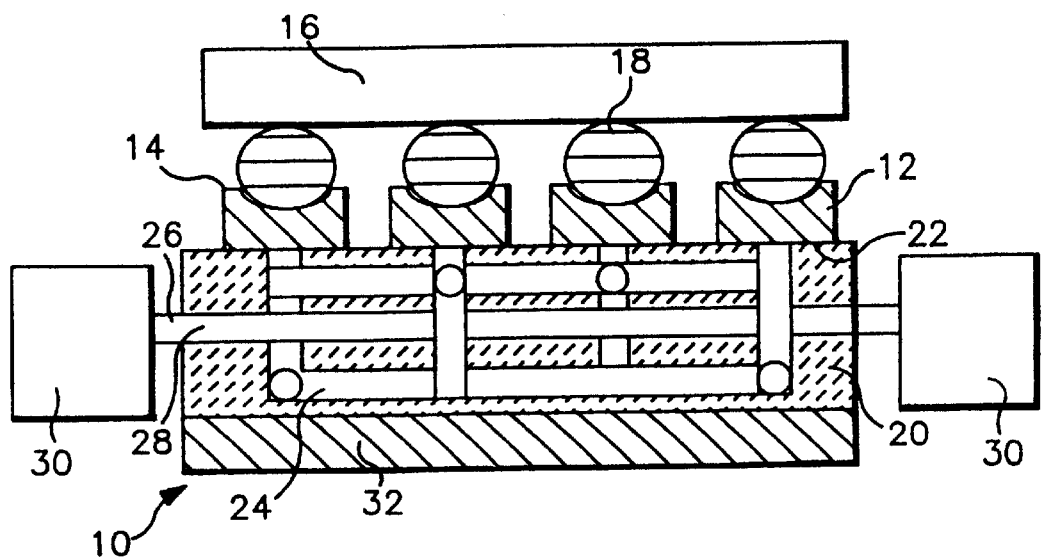
FIG. 1B shows a front view, partially in cross section, of the preferred embodiment of the invention shown in FIG. 1A.

Reference is now made to FIGS. 1A, 1B, 2A and 2B which illustrate the preferred embodiments of the composite structure 10 and 10' of this invention, also referred to as a composite wiring structure, while FIGS. 3A–3F illustrate the sequential steps used to create the composite structure with an electrical network, interconnects and heat sinks internal to the composite's dielectric member. For ease of understanding of this invention, like reference numerals will be used throughout the following description to identify identical elements illustrated in all embodiments.

The composite circuit wiring structure 10, although not limited thereto, is primarily used as a circuit wiring board, or, alternatively, as a multichip module. In the preferred embodiment of the invention shown in FIGS. 1A and 1B, the composite structure 10 has a top conductive, preferably metal member 12 with an exterior major surface 14 upon which at least one SIC 16 eventually will be mounted. Any suitable series of conductive members 18 form an electrical contact between the top metal member 12 and the integrated circuits of the SIC 16. With the preferred embodiment of the invention shown in FIGS. 1A and 1B, the top metal member 12 functions as an electrode contact. The composite structure 10 of this invention further includes a ceramic or an organo-ceramic dielectric member 20 bonded preferably by a covalent bond to the interior major surface 22 of the top metal member electrode 12, and an electrical interconnection network 24. The electrical interconnection network 24 is made up of at least one conductive wire, preferably metal such as copper, embedded within the ceramic or organo-ceramic member 20 (also referred as dielectric member 20). The copper wire is bonded at one end to the interior major surface 22 of the top metal member electrode 12 in at least one location, that is, where the top metal member makes electrical contact to the SIC 16. The at least one wire forming the electrical interconnection network 24 may optionally also have a wire termination 24A that protrudes through an exterior minor surface of the dielectric member 20 to form an electrical contact, through the electrical interconnection network 24, between a top metal member electrode 12 and at least one input/output signal driver 25 that is external to the circuit wiring board. A further embodiment of the present invention illustrative of the use of a mounting support utilized with the interconnection network 24 is described in detail with respect to FIGS. 4A and 4B. Electrical contact between the SIC 16 and an external signal input/output driver may alternatively be made between two top metal member electrodes that are linked through the metal, preferably copper, wire of electrical interconnection network 24.

The composite wiring structure 10 of this invention further includes a thermal distribution network 26 embedded within the dielectric member 20 and electrically insulated or isolated from the electrical interconnection network 24. The thermal distribution network 26 includes at least one heat sink that is located in the vicinity of, but is not in contact with, the interior major surface 22 of the top metal member 12 at a location where the top metal member 12 makes electrical contact with the SIC. The heat sinks 28 forming the thermal distribution network 26 may be composed of elongated thermally conducting material, for instance, a high thermal conductivity metal such as copper, or the heat sinks may be alternatively composed of hollow tubes through which a thermally absorbing fluid is circulated. The heat sinks 28 forming the thermal distribution network 26 protrude through at least one exterior minor surface of the ceramic or organo-ceramic dielectric member 20 and are placed in thermal contact with a thermal reservoir(s) 30.

The thermal reservoir 30 may be simultaneously used as or connected to a mechanical fixture that secures the circuit wiring board to an electrical ground, or both. Both preferred embodiments of composite wiring structure 10 and 10' of this invention also comprise a bottom metal member 32 bonded to the opposing major surface of the dielectric member 20. The dielectric member 20 may be composed of an aluminate ($Al_2O_3$) or silicate ($SiO_2$) based ceramic or organo-ceramic composite. The composite wiring structure 10 of the invention may be configured to electrically connect a single SIC to one or multiple external signal input/output drivers, or configured to interconnect multiple SICs mounted on the top metal member to each other as well as to one or multiple external input/output signal drivers.

Figure 2A:
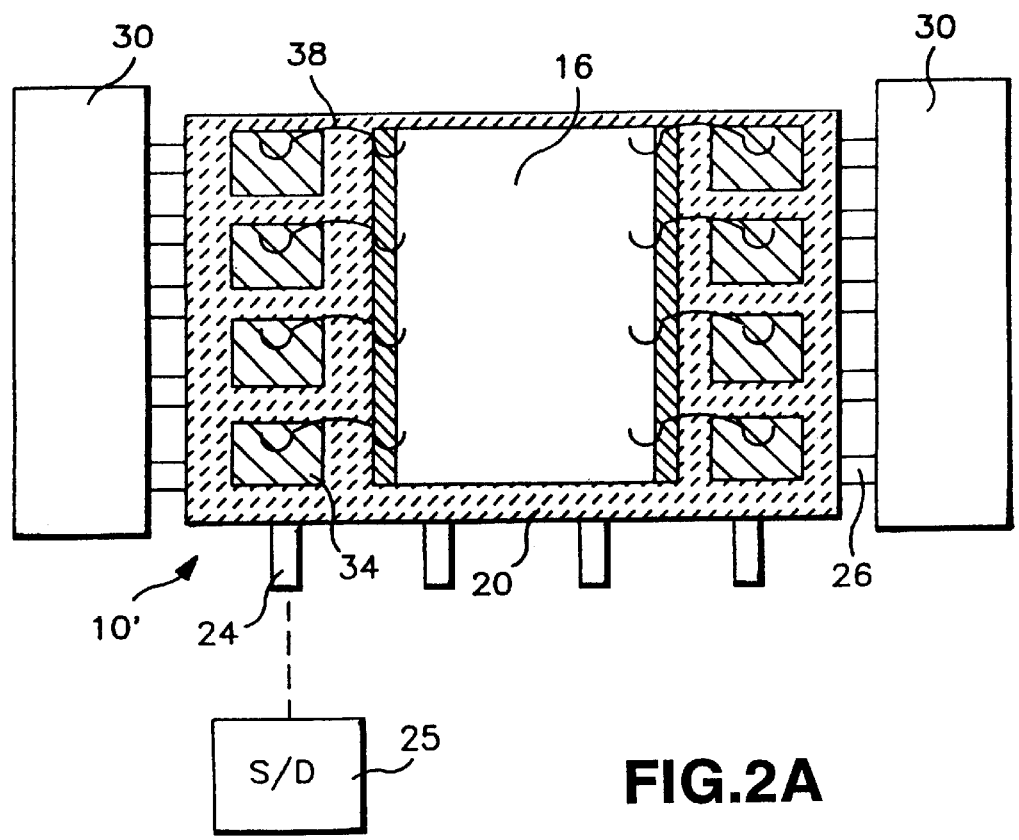
FIG. 2A shows a top view of another preferred embodiment of the dielectric composite wiring structure of this invention.
Figure 2B:
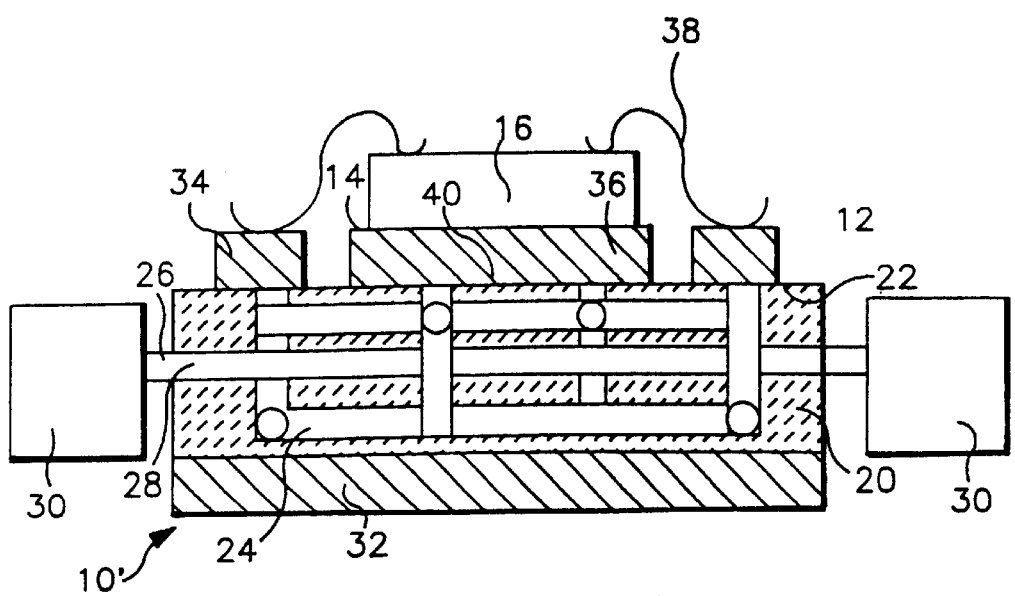
FIG. 2B shows a front view, partially in cross section, of the preferred embodiment of the invention shown in FIG. 2A.

Another preferred embodiment of the invention is shown in FIGS. 2A and 2B wherein the composite wiring structure 10' has the top metal member 12 segmented into electrode areas 34 and at least one mounting area 36. In this embodiment of the invention the electrical interconnection network 24 is embedded within the dielectric member 20 and connects, through at least one conductive wire, preferably metal such as copper, the electrode areas 34 of the top metal member 12 to an external signal input/output driver. The SIC 16, bonded to a mounting area 36 of the top metal member 12, is electrically connected to at least one electrode area 34 by means of a wire conductor 38. The electrical interconnection network 24 may electrically connect the SIC 16 to the external signal input/output driver through at least one metal wire that protrudes through a minor surface of the dielectric member 20, or through another free electrode area 34 that is part of the top metal member 12. In addition, in this embodiment of the invention, at least one heat sink 28 of the thermal distribution network 26 may, optionally, directly connect a mounting area 36 of the top metal member 12 to a thermal reservoir 30 (as shown at 40) external to the circuit wiring board through a heat sink protruding through a minor surface of the dielectric member 20. A bottom metal member 32 is bonded to the exterior major surface of the dielectric member 20 that opposes the major surface that is bonded to the top metal member 12.

Figure 3A:
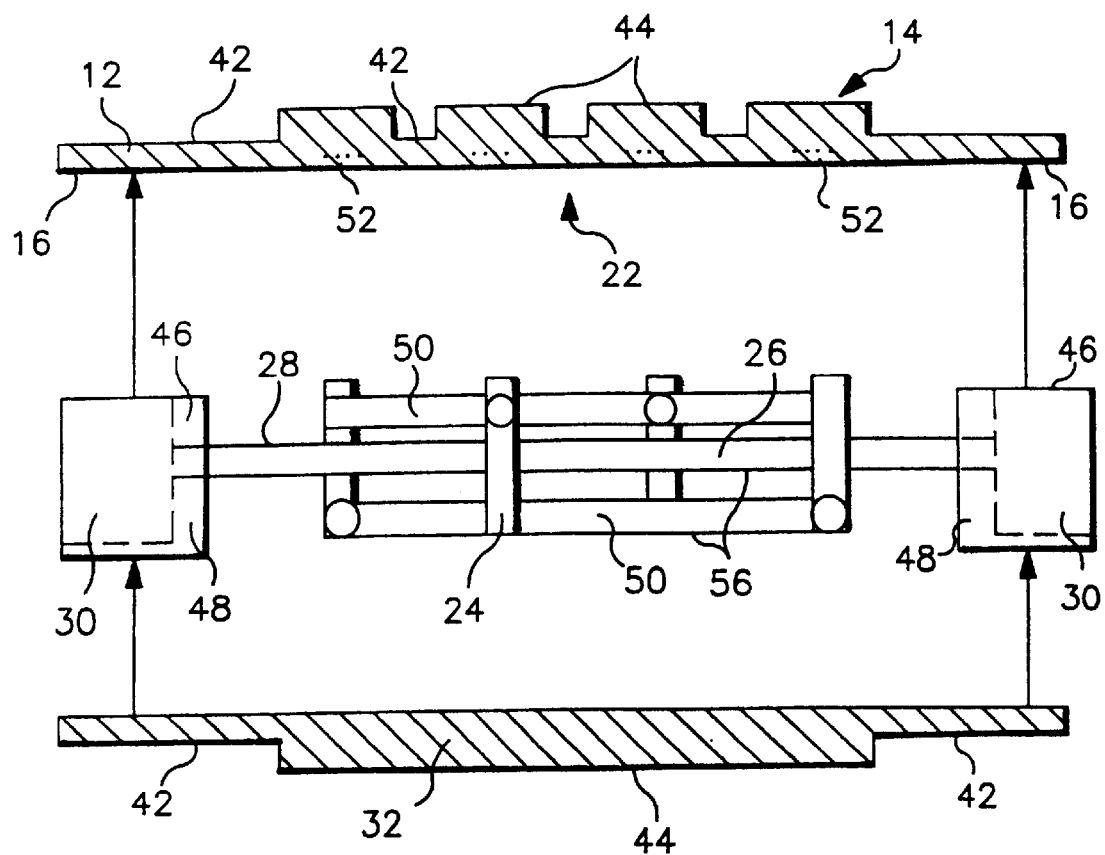
FIGS. 3A (exploded fashion), 3B and 3C show the details of the assembly methods used to construct the dielectric composite wiring structure of this invention.

Reference is now made to FIGS. 3A–F for a detailed explanation of the methods to reduce the above referenced ceramic composite wiring structures 10 and 10' to practice. As shown in FIG. 3A the top metal member 12, preferably a copper sheet 0.5 mm to 3 mm in thickness, is used initially as a substrate upon which the electrical interconnection network 24, thermal distribution network 26 and dielectric member 20 will be formed. Opposing areas are designated on both the exterior major surface 14 and the interior major surface 22 as electrode areas 34, and, if designs as depicted in the embodiment of FIGS. 2A and 2A are produced, as mounting areas 36. The remaining area(s) 42 that are not part of the designated areas 44 on the top metal member 12, may be selectively scribed, etched, or pressed to have lesser thickness than the designated areas on the major surface of the top metal member 12 that will become the exterior major surface 14 prior to using the copper sheet or metal member 12 as a substrate. It is preferred practice, during construction, to orient the exterior major surface 14 face down (that is, FIGS. 3A–F would actually be viewed upside down) and to place mounting supports 46 which may be removed over the interior major surface in those regions of the remaining area(s) 42 that will not functionally serve as a part of the circuit wiring board.

Figure 4B:
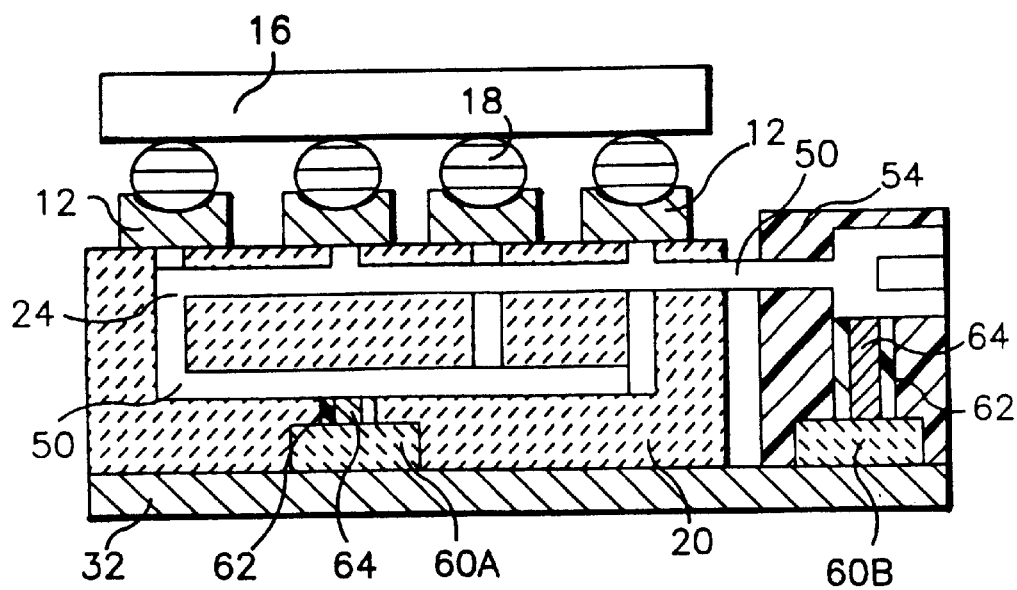
FIG. 4B shows a cross sectional side view of the embodiment of the invention taken along line IV—IV of FIG. 4A with thermal distribution network omitted for clarity.
Figure 4A:
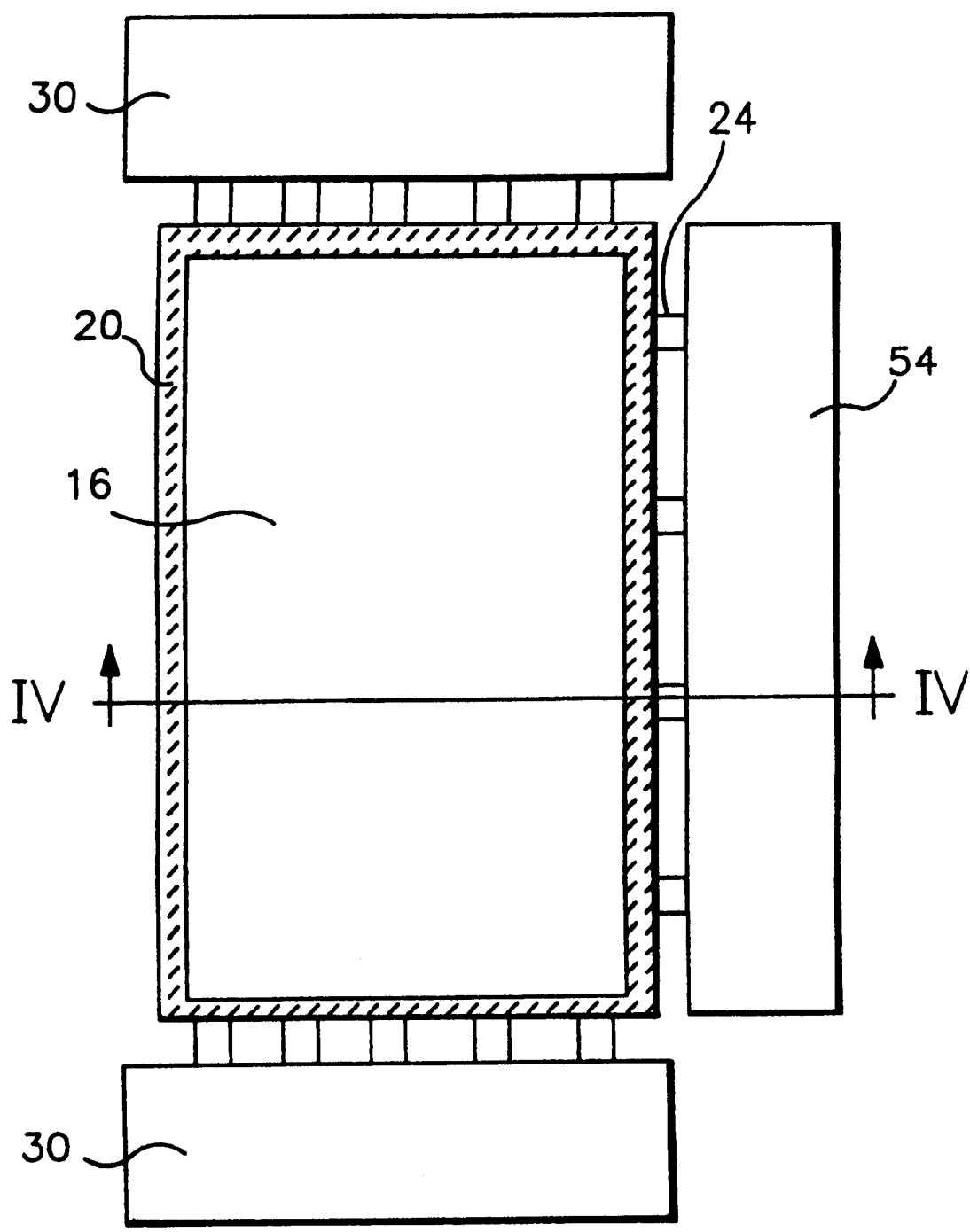
FIG. 4A shows a top view of a further embodiment of the dielectric composite wiring structure of this invention.

The mounting supports 46 (preferably being removable) may be made of a solid material that has bore holes of appropriate diameter to secure terminal points of those segments of heat sink 28 used to form the thermal distribution network 26 or even, in some cases, the wires of the electrical network 24. A mounting support 54 as shown in FIGS. 4A and 4B, optionally removable, may be utilized in conjunction with the metal wire used to form the electrical interconnection network 24 that protrude from the minor surface(s) of the dielectric member 20. The actual details of the mounting support 54 is described in detail with respect to FIGS. 4A and 4B.

Alternatively, the removable mounting supports 46 may be a form of plastic material that solidifies or gels into a solid or semi-solid mold after the segments of heat sink 28 and/or metal wire (preferably made of copper or other theramlly conductive material) are embedded in it, or it may take the form of a combination of solid material and plastic material. A wide variety of plastic, glass, ceramic, or metallic materials may usefully serve as the removable mounting supports 46, provided the selected materials do not form a permanent bond with the copper substrate, retain their solid or semi-solid molded form at process temperatures ranging between 225–475 degrees C., and can be easily removed, preferably by soluble means that does not erode the dielectric member 20, metal members 12 and 32, and the network members 24 and 26. Recommended removable mold materials include a plastic composite comprising polyvinyl formal, or polyvinyl butyral, loaded with hollow silica and a high temperature organic adhesive. Suitable high temperature adhesives include, but may not be limited to, aromatic heterocyclic polymers, such as benzimidazole polymers, or ethynyl-terminated polyimides with small additions of hydroquinone to retard thermal reactions of the ethynyl groups, or arylene-ethers, commercially available as Polymer 360 or Astrel 360. The removable mold materials are typically formed at temperatures ranging between 350 degrees C. and 470 degrees C. under pressures of 50 psi to 2000 psi, and should be made to withstand the ceramic processing temperatures (225 degrees C. to 475 degrees C.), be resistant to the etchants used to remove the remaining areas 42 of the metal members 12 and 32, and yet be sensitive to dispersal in a solvent that is inert to the dielectric member 20, metal members 12 and 32, and the materials that comprise the electrical interconnection network 24 and the thermal dissipation network 26.

It is essential to the proper functioning of the circuit wiring board that the electrical interconnection network 24 and thermal dissipation network 26 are electrically insulated or isolated from one another in the finished body. Therefore, all portions of the electrical interconnection network 24 must not physically contact any portion of the thermal dissipation network 26, and vice-versus, prior to and after the application of the dielectric member 20. It is also imperative that an intertwining electrical interconnection network 24 and thermal dissipation network 26 are physically organized such that the distances separating the two are sufficient to ensure electrical isolation over anticipated voltages after the dielectric member 20 is inserted between them. Ideally, the thermal dissipation network 26 should be connected to an electrical ground.

Manufacturing efficiency can be increased if some of the mounting supports 46 also comprise, in part, removable material 48 that will not form part of the final circuit board, and the thermal heat reservoirs 30 to which the thermal distribution network 26 will be connected via the heat sinks 28 embedded in the dielectric member 20 that protrude through a minor surface of the dielectric member 20. The heat sink/mounting supports can only be positioned in the remaining areas 42 that are adjacent to the minor surfaces of the dielectric member 20 through which only heat sinks 28 connected to the thermal distribution network will protrude.

Those segments 50 of the copper wire used to form the electrical interconnection network 24 and those segments of heat sinks 28 used to form the thermal distribution network 26 that will protrude from the dielectric member 20 once the circuit wiring board is completed are embedded into the mounting supports 46. When a thermal reservoir 30 is incorporated as part of the mounting support 46, those segments of heat sinks that will protrude from the minor surface(s) of the dielectric member 20 are attached through the material 48 of the mounting support to the thermal reservoir 30. The mounting supports 46 with embedded segments of copper wire and heat sinks are then positioned on those regions of remaining areas 42 on the interior surface 22 of the top metal member 12 that will not functionally serve as part of the composite wiring board as shown in FIG. 3B.

Figure 3B:
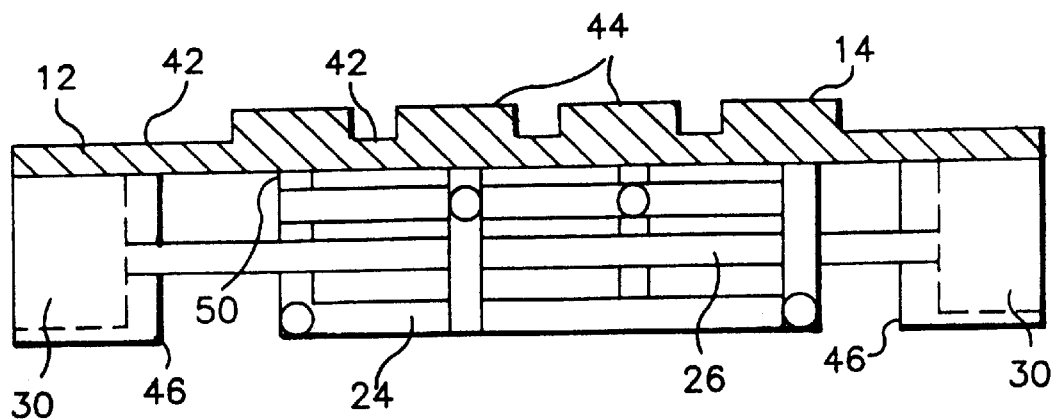
FIGS. 3D (exploded fashion), 3e and 3F show further details of the assembly methods used to construct the dielectric composite wiring structure of this invention.

As illustrated in FIG. 3B, terminal points of the metal wire that form the electrical interconnection network 24 are then bonded to the interior surface 22 of the metal sheet at those substrate areas designated as electrode areas 34 as described with reference to FIG. 2A. Bonding the metal wire to the metal sheet can be achieved using a variety of brazing materials well-known to practitioners skilled in the art, electro-welding, arc-welding, or ultrasonic bonding. It is recommended to select a bonding technique that is appropriate to the electrical properties expected from the finished circuit wiring board. A preferred method of the invention is to use a bonding technique such as arc-welding to form a metal bond between the electrical interconnection network 24 and the designated electrode areas 34 of the copper metal sheet, although other conventional techniques may also be utilized.

The electrical interconnection network 24 is formed by bending a bonded metal wire and electrically contacting it to another metal wire, or a plurality of such metal wires, so constructed in a manner that is consistent with the circuit wiring pattern specified for the SIC(s) and the external input/output signal drivers. Although arc-welding is the recommended means by which to form electrical interconnections between metal, preferably copper, wires so constructed, other conventional techniques may be also utilized. The invention may be used to construct a blind via by electing not to bond a copper wire so constructed with any other copper wires and terminating the blind via metal wire at another electrode area, or by terminating the blind via metal wire in a removable mounting support. A pre-constructed wire lattice used to form the electrical interconnection network 24 that is press-fit at its terminal points into inserts 52 drilled into the electrode areas 34 of the copper sheet substrate may alternatively be constructed, for instance, from a vacuum cast. This method of preparing the electrical interconnection network is depicted in FIG. 3B for convenience. When it is intended to produce a circuit wiring board that comprises electrode areas and mounting areas, according to the preferred embodiment depicted in FIGS. 2A and 2B, contact sections of heat sinks 28 comprising the thermal distribution network 26 may be bonded to the mounting areas 36 using the methods described above for contacting terminal points of the electrical interconnection network 24 to the electrode areas 34.

As pointed out above, mounting supports 46, may optionally be removed after the circuit wiring board "CWB" is fully assembled. The mounting support may, alternatively, remain as a permanent fixture in the finished CWB as a component. As shown in FIGS. 4A and 4B mounting support 54, electrically connects the conducting wire(s) 50 forming the electrical interconnection network 24 to input/output signal drivers (not shown) that are external to the CWB. An illustration of a completed form of this embodiment, inclusive of the electrically connecting permanent mounting support, is shown in FIGS. 4A and 4B.

Figure 3C:
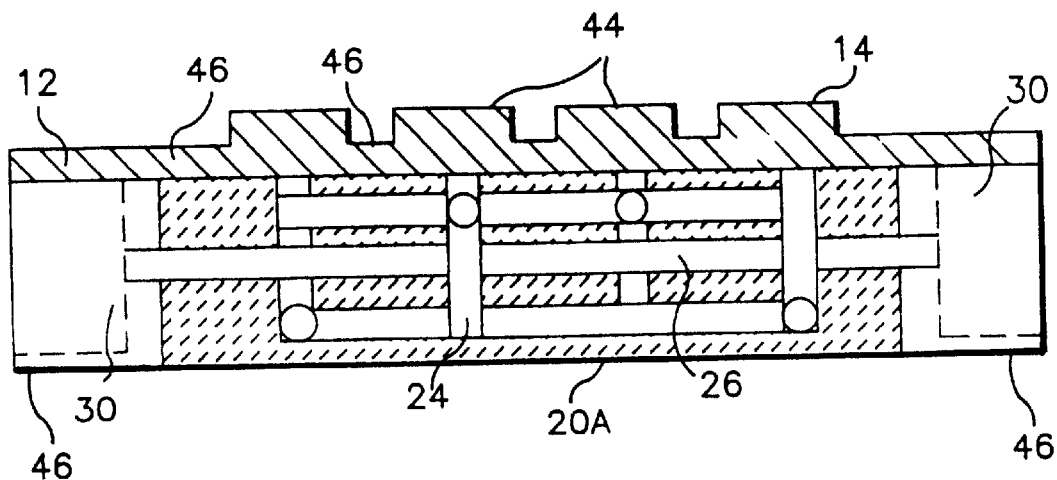

Once the electrical interconnection network 24 and the thermal distribution network 26 have been fixed to the metal substrate as shown in FIG. 3B, the dielectric material 20A forming dielectric member 20 is applied as shown in FIG. 3C to the metal substrate and the network constructions by solution processing using methods that form a direct covalent bond between the metal members and the ceramic or organo-ceramic composite dielectric. Ceramic precursors can be dissolved in solution using techniques such as sol-gel, and/or metalorganic decomposition ("MOD"). The previously mentioned sol-gel techniques utilize metal alkoxide precursors to polymerize an inorganic ceramic network through alcohol condensation reactions. A fairly viscous precursor solution may be applied to the metal substrate and network constructions by pouring, spraying, spray-pyrolyzing, or screen-printing the precursor preparation into wells defined by the removable mounting supports 46. The precursor solution is then reacted or decomposed in an oxidizing atmosphere to form the desired ceramic phase by heating the metalorganic precursors to temperatures above their decomposition points, (i.e., preferably 225–475 degrees C.), in the case of MOD-prepared ceramic, or by heating to accelerate polymerization and alcohol evaporation from sol-gel derived ceramic.

Alumina, with a relative dielectric permittivity of 10, and silica with a relative dielectric permittivity of 3.8, are preferred ceramic phases because of their ability to limit dielectric loss, thereby allowing electronic signals, in the case of a pure silica ceramic member, at frequencies as high as 1.2–1.5 GHz to be propagated through the electrical interconnection network 24.

Ceramic precursors may be reapplied and the reaction/decomposition process repeated, using increasingly lower viscosity solution preparations, to fill voids in the dielectric (ceramic) 20A that may exist after the ceramic member is initially formed. Such voids may alternatively be filled by infiltrating or impregnating the ceramic member with a low-dielectric or stress relieving organic preparation, such as, polyvinyl formal, to form an organo-ceramic composite dielectric. Polyvinyl formal has a dielectric constant of 3, a dissipation factor of 0.02 and a dielectric strength (⅛ thickness) equal to 300 Volts/mm. Poylvinyl butyral, which has a dieLectric constant of 2.6 and a dissipation factor of 0.027 is another suitable impregnant. The use of carboxylic acid salt precursors and the MOD process is a preferred embodiment of this invention. Alumina 2-ethylhexanoate is a preferred metalorganic precursor for alumina ceramic members, and silicon 2-ethylhexanoate is the preferred metalorganic precursor for silica ceramic members.

Organo-ceramic composite dielectric materials may alternatively be formed by spray-pyrolyzing the solution on to the circuit wiring board assembly heated to temperatures above the initial decomposition temperature(s) of the dissolved carboxylic acid salt(s), (225–375 degrees C.), yet below the temperatures at which the salt(s)'s organic ligands thoroughly decompose, (400–475 degrees C.). During spray-pyrolytic decomposition the carboxylic acid evaporates, depositing waxy carboxylic acid salts that decompose in situ. When the circuit wiring board assembly is heated to an appropriate temperature, the resultant dielectric material is a matrix of fully deflagrated oxide ceramic with incompletely decomposed organic material, thereby producing an organo-ceramic dielectric member. This organo-ceramic composite material can be maintained if the deposited dielectric and circuit wiring assembly is not exposed to temperatures above 400 degrees C., which would cause the organic fraction to rapidly decompose. The organic content in these spray-pyrolyzed organo-ceramic composite dielectrics can be increased by adding low-volatility resins, such as polyvinyl butyral, and/or high temperature adhesives that compatible with polyvinyl butyral to the carboxylic acid salt ("MOD") solution. Polyvinyl butyral typically decomposes at temperatures above 450 degrees C., and, thus, sticks to the matrix of partially decomposed carboxylic acid salts deposited via spray-pyrolysis at temperatures between 225–375 degrees C.

Figure 3D:
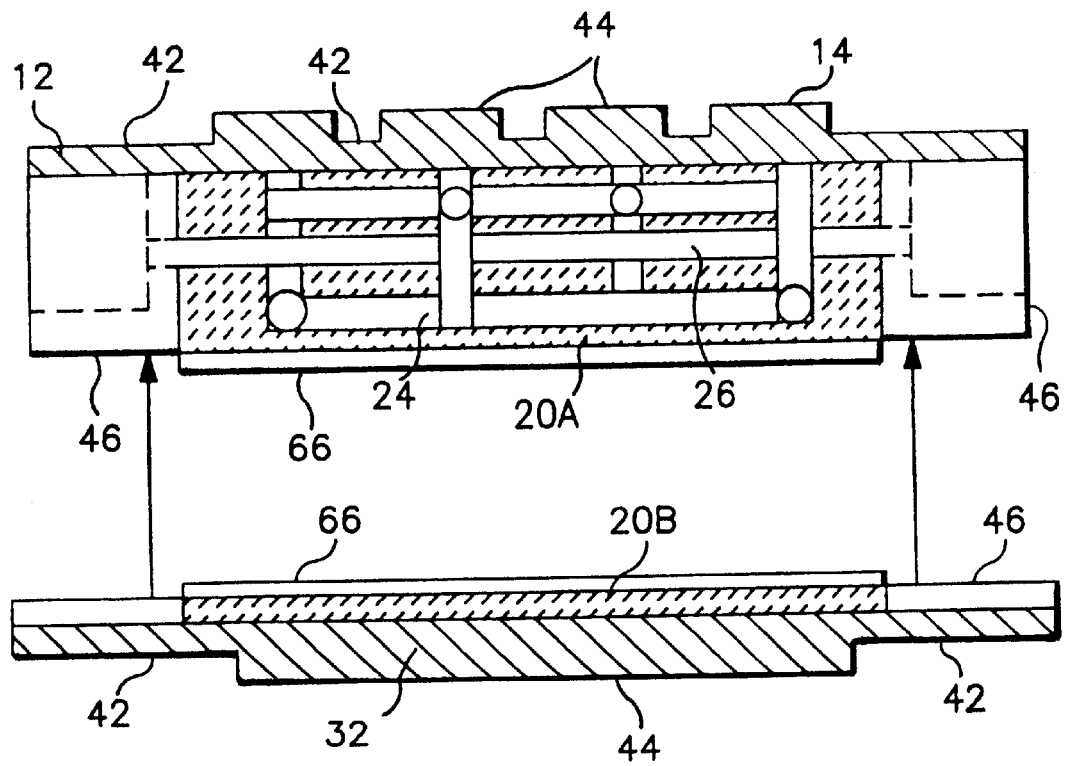

Once the dielectric material 20A has been formed to completely envelop the electrical interconnection network 24 and the thermal distribution network 26 embedded within, its top surface is rough ground to prepare a microscopically coarse surface, i.e., with a median surface roughness that is greater than 35 microns. As shown in FIG. 3D, the major surface of the ceramic face of a similarly prepared metal-ceramic composite comprising the bottom metal member 32 and a dielectric member 20B, that may not necessarily have any electrical interconnection and thermal distribution networks internal to its body, is bonded to dielectric member 20A. This is accomplished through means of a low melting-temperature oxide glass 66 (such as a silica-borate, silica-phosphate, or alumina-silica-phosphate or alumino-silica-borate phase) or polymer adhesive. The low-melting temperature bonding agent is applied to either or both major surfaces of dielectric members 20A and 20B at a temperature above the softening point of the glass phase, pressing the two composites together, dielectric-face to dielectric-face, and cooling the pressed body below the softening point of the glass. The two dielectric members 20A and 20B may alternatively be adhered to one another using a suitable polymer instead of the low melting temperature glass. Should an organic adhesive be used to bond the composite, it must be resistant to the solvent used to disperse the removable material 48 of the removable portion of the mounting supports 46. Therefore, it is recommended to use cross-linked ethynyl-terminated polyarylene ethers, which have demonstrated impressive adhesive properties at elevated temperatures and the ability to resist solvents.

Figure 3E:
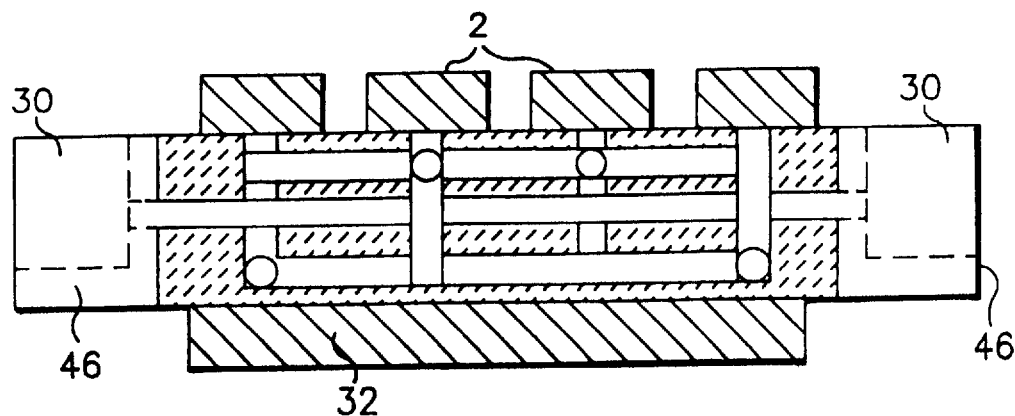
Figure 3F:
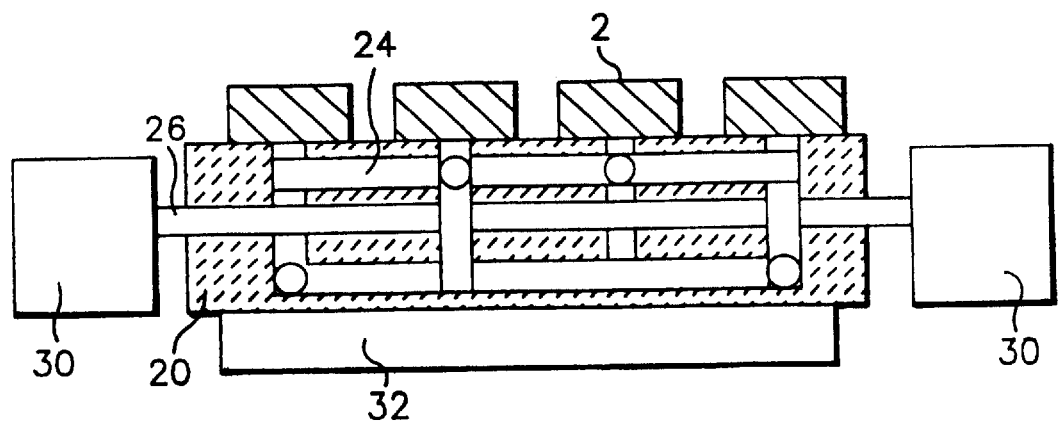

Once the full composite has been formed as shown in FIG. 3E, the remaining areas 42 that will not form part of the finished wiring board are removed by etching those thinned portions of the top metal member 12 and the bottom metal member 32. The partially completed composite needs to be designed and structured to expose the removable material 48 of the mounting support(s) 46 once remaining areas of the top metal member 12 and the bottom metal member 32, respectively, have been dispersed. The removable material portions 48 of the mounting support(s) 46 are then dispersed to produce the completed composite circuit wiring board with internal copper wire electrical interconnection and thermal distribution networks as shown in FIG. 3E.

In a further embodiment of the invention, at least one internal blocking capacitor, preferably a solid state or ceramic capacitor (designated individually as capacitors 60A and 60B), connect at least one conducting wire 50 in the electrical interconnection network 24 to an electrical ground. The capacitance(s) of the internal blocking capacitor(s) 60A and B are selected so as to reduce any unwanted parasitic electrical signal(s) (noise) and improve the signal-to-noise ratio of an electrical signal traveling through the electrical interconnection network 24 between the SIC and any input/out signal drivers (not shown) external to the CWB. The incorporation of the internal blocking capacitor(s) is illustrated in FIG. 4B, in which the metal member 32 that opposes the metal member 12 upon which the SIC is placed is configured to function as electrical ground.

The internal blocking capacitor(s) 60A may be embedded within the dielectric member 20 by fixing the internal blocking capacitor 60A on the metal member 32 prior to applying that portion of the dielectric member 20 that will envelop the internal blocking capacitor 60A. The capacitor 60A may be electrically connected to at least one conducting wire 50 in the electrical interconnection network 24 by creating a hole or via 62 in the dielectric member 20 located above the internal blocking capacitor 60A and filling the hole or via 62 with an electrically conducting substance 64, such as a solder or a metal paste, that is also placed in electrical contact with the at least one conducting wire 50.

It is possible with the present invention to house the internal blocking capacitor 60B within mounting support 54 that remains as a permanent fixture of the CWB. As with capacitor 60A a hole or via 62 with an electrically conducting substance 64 is also placed in electrical contact with the at least one conducting wire 50. The capacitor 60B is used to electrically connect the SIC to input/output signal drivers external to CWB through the electrical interconnection network 24. This preferred embodiment of the invention is also depicted in FIG. 4B. An example of the blocking capacitors that can be used with the present invention could be, but is not limited to, ceramic capacitors, preferably, multilayer ceramic capacitors.

A fundamental problem with incorporating metal wire or pipe networks within a dielectric member relates to the large mismatch(es) in the coefficients of thermal expansion between the metal and ceramic dielectric compositions, and the internal stresses, fracturing, or deformation that are generated when the composite body is thermally cycled. This problem is particularly acute when copper, which has a coefficient of thermal expansion of $16.5 \times 10^{-6}$ degrees $C^{-1}$, is embedded in pure silica, with a coefficient of thermal expansion of $0.5 \times 10^{-6}$ degrees $C^{-1}$. The mismatch between alumina ceramic, which has a coefficient of thermal expansion equal to $8.8 \times 10^{-6}$ degrees $C^{-1}$, and copper is less severe, but less problematic. Heat generated by the SIC 16 is dissipated into the circuit wiring board. As the thermal distribution network 26 transfers this heat to the heat sinks exterior to the circuit wiring board it will heat, expand and compress the dielectric member.

Figure 5A:
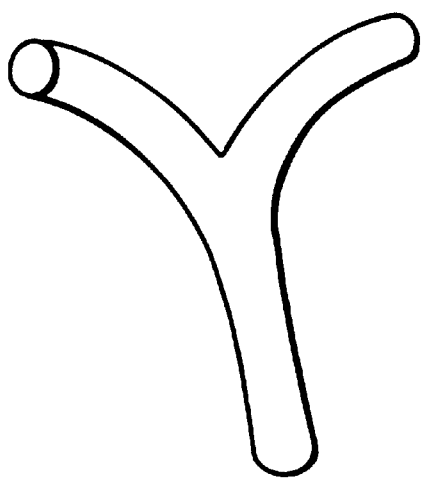
FIGS. 5A and 5B show, in pictorial fashion, portions of curved network members, embedded within the dielectric, utilized with the dielectric composite wiring structure of this invention.
Figure 5B:
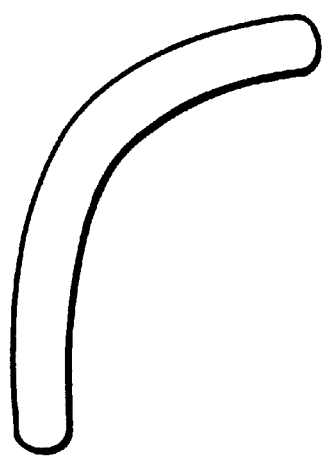

Two methods are employed within the present invention to reduce the deleterious effects of stress on the ceramic member and the embedded network structures. The first deploys curves in the design of the embedded network structures to high stress points that result from sharp edged structures. When the network structures are designed with curved, rather than sharp-cornered L-joints and T-joints as shown in FIGS. 5A and 5B, the stress is more evenly distributed over the radial arcs, as opposed to building up intense compressive forces at the sharp critical points in the network. Optimal radii of curvature for the network joints, and even the specific cross-sectional shapes of the copper wires or heat sinks used to form these networks is depended upon the thermal load imposed by the SIC and can be derived by any practitioner skilled in the art of computer simulation methods, such as the finite element method. Second, compressive stress is also reduced in the network by coating the (copper) metal wire forming the electrical interconnection network 24 and the heat pipes 28 forming the thermal dissipation network 26 with an organic resin 56 as shown in FIG. 3A, such as a polyvinyl formal which decomposes at temperatures greater than 430 degrees C., comprising, in-part, a high-temperature adhesive. The resin can be applied by dip-coating a pre-constructed network into a resin bath prior to fixing it to the top metal member 12 and/or the mounting support 46. It is preferred within the present invention to have the organic resin applied using the "pultrusion" method, whereby the metal wire member is drawn through a coating die that applies the resin as it is assembled into the electrical interconnection network 24 on the surface of the metal sheet substrate. The high decomposition temperature of the resin allows the resin to occupy space in the immediate vicinity of the network member. The ceramic member is formed and hardened to the surface of the organic resin at temperatures below the resin's decomposition temperature. The "soft" organic resin may be left in tact to act as a buffer that accommodates unequal lateral displacements between the metal network member and the ceramic member.

The applied resin compound needs to be resistant to the solvent(s) used to disperse the removable material 48 in the mounting support(s) 46 if it is to remain an integral part of the composite. Alternatively, the resin can be removed by heating the composite in an oxidizing atmosphere to temperatures in excess of its thermal decomposition temperature, or by dissolving it in a suitable dispersant. Once the resin is removed, a void space is created between the hardened ceramic member and the metal wire and/or heat sinks. This void space allows the network member to slip relative to the surrounding dielectric member when the metal network member expands or contracts to a larger degree than the surrounding dielectric member. The depth of the void space, and, hence, the thickness of the organic resin coating, is determined by the relativedegree of play that would be required between the metal network member and the surrounding dielectric during maximal operational cycles for a given SIC.

Although this invention has been described with respect to various embodiments, it should be realized this invention is also capable of a wide variety of further and other embodiments within the spirit and scope of the appended claims.

We claim:

1. A composite structure for management of electrical and thermal conduction from at least one semiconductor device, comprising:

a composite, with at least one electrical conductor forming a portion of an electrical network and at least one thermal conductor forming a part of a thermal network, said at least one electrical conductor bonded to an electrically insulating dielectric member, and said dielectric member encompassing the electrical and thermal networks;

said electrical and thermal conductors and networks formed thereby being arranged within said dielectric member in electrical isolation from each other;

said composite made by in-situ formation of the dielectric around said electrical network and said thermal network and said dielectric member being bonded to said at least one electrical conductor via a covalent bond formed at a temperature less than 475 degrees C.; and the structure as a whole being constructed and arranged to enable heat transfer from the electrical network and the semiconductor device to and through the thermal network.

2. The composite structure as defined in claim 1 wherein said dielectric member is further bonded to said at least one thermal conductor via a covalent bond formed at less than 475 degrees C.

3. The composite structure as defined in claim 1 wherein said electrical and thermal networks are made up of components which are coated with an organic resin which decomposes at temperatures greater than 475 degrees C.

4. The composite structure as defined in claim 1 wherein said electrical network is made up of a plurality of interconnected conductive wire segments, portions of said wire segments protruding through a major surface of said dielectric member in order to electrically connect to the at least one semiconductor device.

5. The composite structure as defined in claim 1 further comprising means external to said dielectric member operably connected to said thermal network for providing a thermal reservoir for said thermal distribution network.

6. The composite structure as defined in claim 1 further comprising an additional conductive member for electrically connecting said electrical network to the at least one semiconductor device.

7. The composite structure as defined in claim 1 further comprising at least one capacitor embedded within said dielectric member and being electrically connected between said electrical network and another electrical conductor.

8. The composite structure as defined in claim 1 wherein said electrical and thermal networks are made up of curved components.

9. The composite structure as defined in claim 1 further comprising a support structure and said electrical and thermal networks being secured to said support structure.

10. The composite structure as defined in claim 1 wherein said thermal network is made up of at least one heat sink, portions of said heat sink being operably connected to said at least one electrical conductor.

11. The composite structure as defined in claim 1 wherein the at least one semiconductor device is in combination with said at least one electrical conductor.

12. The composite structure as defined in claim 1 wherein the at least one semiconductor device is in combination with said at least one electrical conductor and thermal conductor.

13. The composite structure as defined in claim 1 wherein said dielectric member is a ceramic.

14. The composite structure as defined in claim 1 wherein said dielectric member is an organo-ceramic.

15. The composite structure as defined in claim 1 wherein said dielectric member comprises an alumina-based ceramic material.

16. The composite wiring structure as defined in claim 1 wherein said dielectric member comprises a silica-based ceramic material.

17. The composite structure as defined in claim 9 wherein said support structure includes a thermal reservoir for said thermal network.

18. A composite structure for use with at least one semiconductor device, comprising:

means for providing an electrical conduction, said electrical conduction means having an exterior major surface and an interior major surface;

said exterior major surface of said electrical conduction means being capable of having the at least one semiconductor device mounted thereon for electrical connection thereto, means for providing electrical insulation, said electrical insulation means having a major surface bonded to said interior major surface of said conduction means;

a conductive network made up of at least one conductive wire segment embedded within said electrical insulation means, said at least one wire segment being electrically connected to said electrical conduction means; and means for providing thermal distribution, said thermal distribution means embedded within said electrical insulation means and electrically isolated from said conduction means and said conductive network, said thermal distribution means capable of efficiently dissipating heat generated during operation of the at least one semiconductor device.

19. The composite wiring structure as defined in claim 18 wherein said conductive network is made up of a plurality of interconnected conductive wire segments, portions of said wire segments protruding through said major surface of said electrical insulation means in order to electrically connect with the at least one semiconductor device.

20. The composite structure as defined in claim 18 wherein said electrical conductive network is made up of components which are coated with an organic resin.

21. The composite structure as defined in claim 18 wherein said thermal distribution means are made up of components which are coated with an organic resin.

22. The composite structure as defined in claim 18 wherein said electrical insulation means is ceramic and bonded to said electrical conduction means via a covalent bond formed at less than 475 degrees C.

23. The composite structure as defined in claim 18 wherein the at least one semiconductor device is in combination with said electrical conduction means.

24. The composite structure as defined in claim 19 further comprising at least one capacitor embedded within said electrical insulation means and being electrically connected between said conductive network and a conductive member.

25. The composite structure as defined in claim 19 wherein said electrical insulation means is ceramic and is bonded to said electrical conduction means.

26. The composite structure as defined in claim 19 wherein said electrical insulation means is organo-ceramic and bonded to said electrical conduction means.

27. The composite structure as defined in claim 19 further comprising means external to said electrical insulation means operably connected to said thermal distribution means for providing a thermal reservoir for said thermal distribution means.

28. The composite structure as defined in claim 19 wherein said conductive network and thermal distribution means are made up of curved components.

29. The composite structure as defined in claim 24 wherein said electrical insulation means is organo-ceramic and is bonded to said electrical conduction means via a covalent bond formed at less than 475 degrees C.

30. The composite structure as defined in claim 20 wherein said organic resin decomposes at temperatures greater than 430 C.

31. The composite structure as defined in claim 20 wherein said organic resin is thermally decomposed after said electrical insulation means is bonded to said conductive network coated with said organic resin, thereby producing said at least one conductive wire segment within said electrical insulation means having void space separating said at least one conductive wire segment from said electrical insulation means.

32. The composite structure as defined in claim 20 further comprises a support structure and said thermal distribution means is secured to said support structure.

33. The composite structure as defined in claim 32 wherein said support structure includes a thermal reservoir for said thermal distribution means.

34. The composite structure as defined in claim 29 wherein said thermal distribution means is made up of at least one heat sink, portions of said heat sink being operably connected to the at least one semiconductor device.

35. The composite structure as defined in claim 21 wherein said organic resin decomposes at temperatures greater than 430 C.

36. A composite structure for the management of electrical and thermal conduction from at least one semiconductor device, comprising:
- an electrical interconnection network including a plurality of interconnected conductive components formed into a predetermined wiring circuit;
- at least one of said conductive components used to make external electrical connection with the at least one semiconductor device;
- an electrically insulating dielectric member, said dielectric member fully encompassing said electrical interconnection network, except for those portions of said at least one of said conductive components used to make said external electrical connection to the at least one semiconductor device;
- said dielectric member being formed in-situ upon and around said electrical interconnection network, thereby embedding said predetermined wiring circuit within said dielectric member at a temperature less than 475 C.;
- wherein heat transfer can take place between the at least one semiconductor device and an external reservoir.

37. The composite structure as defined in claim 36 wherein said in-situ forming of said dielectric member upon and around said electrical interconnection network takes place via a covalent bond.

38. The composite structure as defined in claim 36 further comprising at least one capacitor embedded within said dielectric member and being electrically connected between said electrical network and another electrical conductor.

39. The composite structure as defined in claim 36 wherein said at least one of said conductive components is curved.

40. The composite structure as defined in claim 36 wherein said dielectric member is ceramic.

41. The composite structure as defined in claim 36 wherein said dielectric member is organo-ceramic.

42. The composite structure as defined in claim 36 wherein said dielectric member comprises an alumina-based ceramic material.

43. The composite structure as defined in claim 36 wherein said dielectric member comprises a silica-based ceramic material.

44. A composite structure for use with at least one semiconductor devices, comprising:
- a first conductive member having a surface upon which the at least one semiconductor device is mounted for electrical connection thereto,
- a dielectric member, said dielectric member having a major surface bonded to said first conductive member;
- a conductive network made up of at least one conductive wire segment embedded within said ceramic member, said at least one wire segment being electrically connected to said first conductive member;
- a thermal distribution network embedded within said ceramic member and electrically isolated from said conductive network, said thermal distribution network capable of efficiently dissipating heat generated during operation of the semiconductor device; and
- a second conductive member, said second conductive member bonded to said dielectric member on a side thereof opposite said first conductive member.

45. The composite structure as defined in claim 44 wherein said dielectric member is a ceramic.

46. The composite structure as defined in claim 44 wherein said dielectric member is an organo-ceramic.

47. A composite structure for management of electrical and thermal conduction from at least one semiconductor device, comprising:
- a composite, with at least one electrical conductor forming a portion of an electrical network and at least one thermal conductor forming a part of a thermal network, said electrical conductor bonded to an electrically insulating dielectric member, and said dielectric member encompassing the electrical and thermal networks;
- said electrical and thermal conductors and networks formed thereby being arranged within said dielectric member in electrical isolation from each other;
- at least one capacitor embedded within said dielectric member and being electrically connected between said electrical network and another electrical conductor; and
- the structure as a whole being constructed and arranged to enable heat transfer from the electrical network and the semiconductor device to and through the thermal network.

48. A composite structure for management of electrical and thermal conduction from at least one semiconductor device, comprising:
- a composite, with at least one electrical conductor forming a portion of an electrical network and at least one thermal conductor forming a part of a thermal network, said electrical conductor bonded to an electrically insulating dielectric member, and said dielectric member encompassing the electrical and thermal networks;
- said electrical and thermal conductors and networks formed thereby being arranged within said dielectric member in electrical isolation from each other;
- said electrical and thermal networks being made up of curved components; and
- the structure as a whole being constructed and arranged to enable heat transfer from the electrical network and the semiconductor device to and through the thermal network.

49. A composite structure for management of electrical and thermal conduction from at least one semiconductor device, comprising:
- a composite, with at least one electrical conductor forming a portion of an electrical network and at least one thermal conductor forming a part of a thermal network, said electrical conductor bonded to an electrically insulating dielectric member, and said dielectric member encompassing the electrical and thermal networks;
- said electrical and thermal conductors and networks formed thereby being arranged within said dielectric member in electrical isolation from each other;
- a support structure, said electrical and thermal networks being secured to said support structure; and
- the composite structure as a whole being constructed and arranged to enable heat transfer from the electrical network and the semiconductor device to and through the thermal network.

50. The composite structure as defined in claim 49 wherein said support structure includes a thermal reservoir for said thermal network.

51. A composite structure for management of electrical and thermal conduction from at least one semiconductor device, comprising:

a composite, with at least one electrical conductor forming a portion of an electrical network and at least one thermal conductor forming a part of a thermal network, said electrical conductor bonded to an electrically insulating dielectric member, and said dielectric member encompassing the electrical and thermal networks;

said electrical and thermal conductors and networks formed thereby being arranged within said dielectric member in electrical isolation from each other;

said thermal network being made up of at least one heat sink, portions of said heat sink being operably connected to said at least one electrical conductor; and the structure as a whole being constructed and arranged to enable heat transfer from the electrical network and the semiconductor device to and through the thermal network.

52. A composite structure for use with at least one semiconductor device, comprising:

means for providing an electrical conduction, said electrical conduction means having an exterior major surface and an interior major surface;

said exterior major surface of said electrical conduction means being capable of having the at least one semiconductor device mounted thereon for electrical connection thereto, means for providing electrical insulation, said electrical insulation means is ceramic and having a major surface bonded to said interior major surface of said electrical conduction means;

a conductive network made up of at least one conductive wire segment embedded within said ceramic electrical insulation means, said at least one wire segment being electrically connected to said electrical conduction means; and said conductive network being made up of components which are coated with an organic resin.

53. The composite structure as defined in claim 52 wherein said organic resin decomposes at temperatures greater than 430 C.

54. The composite structure as defined in claim 53 wherein said organic resin is thermally decomposed after said ceramic electrical insulation means is bonded to said conductive network coated with said organic resin, thereby producing said at least one conductive wire segment within said ceramic electrical insulation means having void space separating said at least one conductive wire segment from said ceramic electrical insulation means.

55. A composite structure for use with at least one semiconductor device, comprising:

means for providing an electrical conduction, said electrical conduction means having an exterior major surface and an interior major surface;

said exterior major surface of said electrical conduction means being capable of having the at least one semiconductor device mounted thereon for electrical connection thereto, means for providing electrical insulation, said electrical insulation means is organo-ceramic and having a major surface bonded to said interior major surface of said electrical conduction means;

a conductive network made up of at least one conductive wire segment embedded within said organo-ceramic electrical insulation means, said at least one wire segment being electrically connected to said organo-ceramic electrical conduction means; and said conductive network is made up of components which are coated with an organic resin.

56. The composite structure as defined in claim 52 wherein said organic resin decomposes at temperatures greater than 430 C.

57. The composite structure as defined in claim 53 wherein said organic resin is thermally decomposed after said organo-ceramic electrical insulation means is bonded to said conductive network coated with said organic resin, thereby producing said at least one conductive wire segment within said organo-ceramic electrical insulation means having void space separating said at least one conductive wire segment from said organo-ceramic electrical insulation means.

* * * * *